US010147720B2

(12) United States Patent
Fujii et al.

(10) Patent No.: US 10,147,720 B2
(45) Date of Patent: Dec. 4, 2018

(54) SEMICONDUCTOR DEVICE, LIQUID-DISCHARGE HEAD SUBSTRATE, LIQUID-DISCHARGE HEAD, AND LIQUID-DISCHARGE DEVICE

(71) Applicant: CANON KABUSHIKI KAISHA, Tokyo (JP)

(72) Inventors: Kazunari Fujii, Tokyo (JP); Toshio Negishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/689,823

(22) Filed: Aug. 29, 2017

(65) Prior Publication Data

US 2018/0061826 A1 Mar. 1, 2018

(30) Foreign Application Priority Data

Aug. 31, 2016 (JP) ................................ 2016-169618

(51) Int. Cl.

| | |
|---|---|
| ***H01L 27/06*** | (2006.01) |
| ***B41J 2/14*** | (2006.01) |
| ***H01L 23/522*** | (2006.01) |
| ***H01L 23/525*** | (2006.01) |
| ***H01L 23/528*** | (2006.01) |
| ***B41J 2/045*** | (2006.01) |
| ***H01L 27/02*** | (2006.01) |
| *H01L 49/02* | (2006.01) |
| *H01L 29/78* | (2006.01) |

(52) U.S. Cl.
CPC ........ *H01L 27/0629* (2013.01); *B41J 2/0458* (2013.01); *B41J 2/04541* (2013.01); *B41J 2/04543* (2013.01); *B41J 2/1433* (2013.01); *H01L 23/528* (2013.01); *H01L 23/5228* (2013.01); *H01L 23/5252* (2013.01); *H01L 27/0207* (2013.01); *B41J 2002/14491* (2013.01); *B41J 2202/13* (2013.01); *H01L 28/20* (2013.01); *H01L 29/7817* (2013.01)

(58) Field of Classification Search
None
See application file for complete search history.

(56) References Cited

U.S. PATENT DOCUMENTS 9,144,978 B2 9/2015 Ohmura
2013/0062728 A1* 3/2013 Kurz .................. H01L 23/5252 257/530

FOREIGN PATENT DOCUMENTS

JP 2014-58130 A 4/2014

* cited by examiner

*Primary Examiner* — Lisa M Solomon
(74) *Attorney, Agent, or Firm* — Canon U.S.A., Inc. IP Division

(57) ABSTRACT

A semiconductor device includes a transistor connected to a terminal having a first potential, an anti-fuse element connected between the transistor and a terminal having a second potential different from the first potential, and a resistor element connected in parallel with the anti-fuse element. An electric path between the transistor and the anti-fuse element has a length smaller than a length of an electric path between the transistor and the resistor element.

23 Claims, 9 Drawing Sheets

SEMICONDUCTOR DEVICE, LIQUID-DISCHARGE HEAD SUBSTRATE, LIQUID-DISCHARGE HEAD, AND LIQUID-DISCHARGE DEVICE

BACKGROUND OF THE INVENTION

Field of the Invention

The present disclosure relates to a semiconductor device including an anti-fuse element having a metal-oxide-semiconductor (MOS) structure, a liquid-discharge head substrate, a liquid-discharge head, and a liquid-discharge device.

Description of the Related Art

In recent years, a One Time Programmable (OTP) memory for recording product unique information after the completion of a product, such as a chip identification (ID) and setting parameters, has been employed in semiconductor devices. Two types of the OTP memories are available. One uses a fuse element and the other one uses an anti-fuse element. Japanese Patent Application Laid-Open No. 2014-58130 discusses a conventional technique with a configuration employing the anti-fuse element.

SUMMARY OF THE INVENTION

A semiconductor device according to an aspect of the present disclosure includes a transistor connected to a terminal having a first potential, an anti-fuse element connected between the transistor and a terminal having a second potential different from the first potential, and a resistor element connected in parallel with the anti-fuse element between the transistor and the terminal having the second potential. An electric path between the transistor and the anti-fuse element has a length smaller than a length of an electric path between the transistor and the resistor element.

A semiconductor device according to another aspect of the present disclosure includes a transistor connected to a terminal having a first potential, an anti-fuse element connected between the transistor and a terminal having a second potential different from the first potential, and a resistor element connected in parallel with the anti-fuse element between the transistor and the terminal having the second potential. The transistor, the anti-fuse element, and the resistor element are arranged on a semiconductor substrate. In a plan view of a surface of the semiconductor substrate in which the transistor, the anti-fuse element, and the resistor element are arranged, a distance between the transistor and the anti-fuse element is smaller than a distance between the transistor and the resistor element.

A semiconductor device according to yet another aspect of the present invention includes a transistor connected to a terminal having a first potential, an anti-fuse element connected between the transistor and a terminal having a second potential different from the first potential, and a resistor element connected in parallel with the anti-fuse element between the transistor and the terminal having the second potential. A wiring for connecting the transistor and the anti-fuse element has a smaller resistance than a resistance of a wiring for connecting the transistor and the resistor element.

Further features of the present disclosure will become apparent from the following description of exemplary embodiments with reference to the attached drawings.

DESCRIPTION OF THE EMBODIMENTS

A semiconductor device discussed in Japanese Patent Application Laid-Open No. 2014-58130 includes an anti-fuse element, a transistor, and a resistor element connected in parallel with the anti-fuse element. Such a semiconductor device has a risk of degradation in accuracy of reading information written into the anti-fuse element due to a parasitic resistance in wiring between the elements. This risk is not mentioned in Japanese Patent Application Laid-Open No. 2014-58130.

Figure 1:
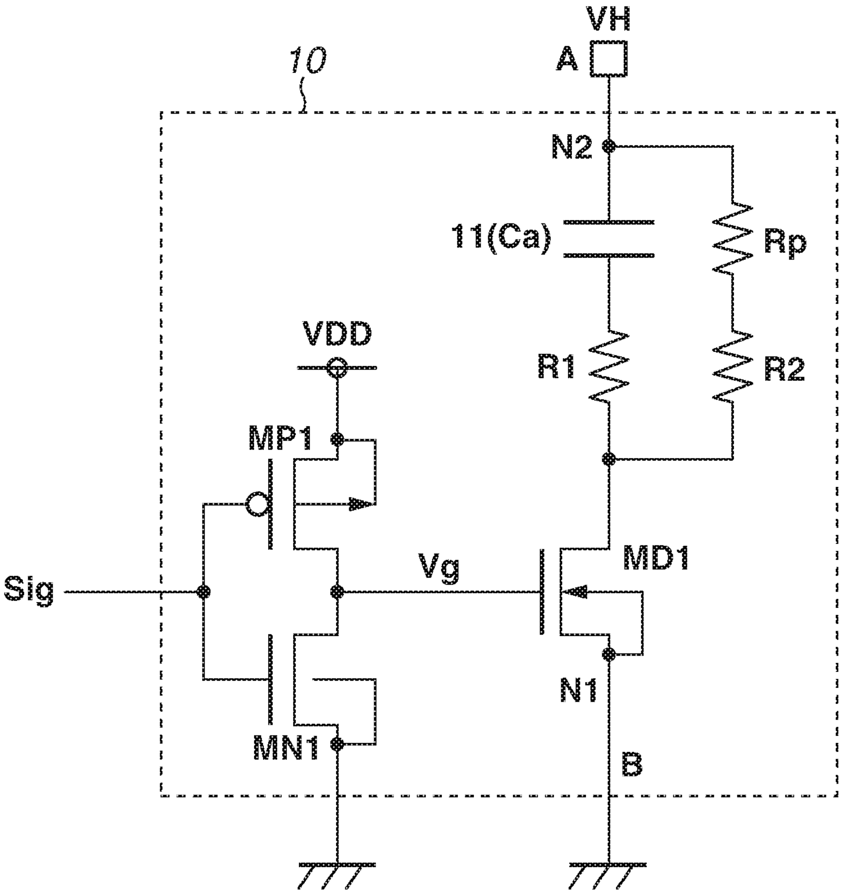
FIG. 1 is a diagram illustrating a circuit configuration of a semiconductor device according to a first exemplary embodiment.

A first exemplary embodiment is described below. FIG. 1 illustrates an example of a circuit configuration of a semiconductor device according to the present exemplary embodiment in a state before information is written to an anti-fuse element.

The semiconductor device according to the present exemplary embodiment includes a memory unit 10 and a power supply terminal A (second potential terminal). The memory unit 10 includes a transistor MP1, a transistor MN1, a transistor MD1, an anti-fuse element 11, and a resistor element Rp (resistor). The anti-fuse element 11 according to the present exemplary embodiment has resistance that varies due to an operation of writing information. More specifically, the anti-fuse element 11 has a large resistance before the information is written. For example, the anti-fuse element 11 functions as a capacitor element Ca before the information is written.

Figure 2:
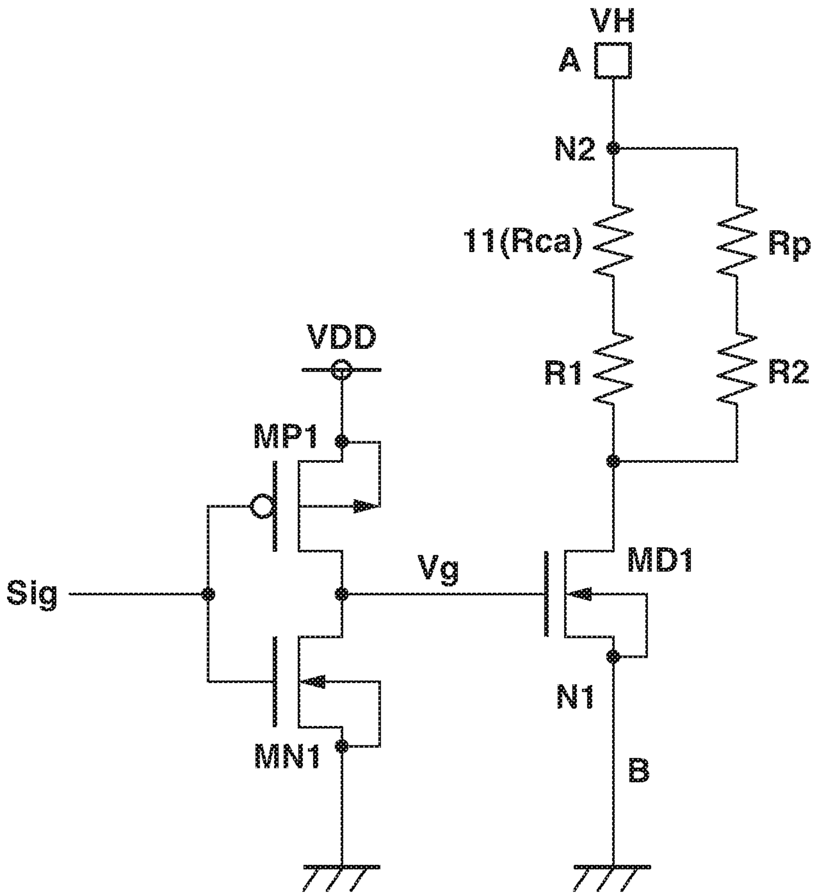
FIG. 2 is a diagram illustrating a circuit configuration of the semiconductor device according to the first exemplary embodiment.

FIG. 1 illustrates the state before the information is written to the anti-fuse element 11, and thus the anti-fuse element 11 is also denoted with Ca. When the information is written, the resistance of the anti-fuse element 11 decreases, so that the anti-fuse element 11 functions as a resistor element. FIG. 2 illustrates the semiconductor device in a state after the information has been written to the anti-fuse element 11. With this configuration, the information written to the anti-fuse element 11 can be read based on a change in the resistance of the anti-fuse element 11.

The transistor MP1 and the transistor MN1 in FIGS. 1 and 2 are a P-type transistor and an N-type transistor, respectively. A control signal Sig is input to gates of the transistor MP1 and the transistor MN1.

Power supply voltage VDD is supplied to one of source and drain terminals and a back gate of the transistor MP1. The other terminal is connected to one of source and drain terminals of the transistor MN1 and a gate of the transistor MD1. The other terminal and a back gate of the transistor MN1 are connected to a ground wiring GND. The transistor MP1 and the transistor MN1 form a logic circuit. The transistor MP1 and the transistor MN1, forming the logic circuit, may have lower breakdown voltage than the transistor MD1 serving as a high-breakdown-voltage transistor. The logic circuit including such a low breakdown voltage transistor can operate at a higher speed.

The transistor MD1, which is the high-breakdown-voltage transistor, controls voltage applied to the anti-fuse element 11. For example, the transistor MD1 may be an n-channel metal oxide semiconductor (MOS) (NMOS) transistor. The high-breakdown-voltage transistor is a transistor with higher breakdown voltage than a transistor (such as the transistor MP1 or the transistor MN1) used for the logic circuit.

The anti-fuse element 11 is connected to a power supply terminal B (first potential terminal) with a first potential via the transistor MD1. An example of the anti-fuse element 11 includes an anti-fuse element having a MOS structure. The resistor element Rp is connected to the power supply terminal B with the first potential via the transistor MD1, and is connected in parallel with the anti-fuse element 11. The anti-fuse element 11 and the resistor element Rp are connected to the power supply terminal A with second potential different from the first potential.

The power supply terminal A and the power supply terminal B are pads for electrically connecting the memory unit 10 and an external element, and are terminals for applying a voltage to the anti-fuse element 11. For example, the potential of the power supply terminal B corresponds to a ground potential, and the potential of the power supply terminal A corresponds to a high voltage VH (for example, 32 V) applied for writing information. In FIG. 1, the transistor MD1 is directly connected to the power supply terminal B, and the anti-fuse element 11 is directly connected to the power supply terminal A. Alternatively, each connection may be established with a different electric element provided therein as long as the functions described in the present exemplary embodiment are not impaired.

More specifically, the transistor MD1 has one of the source and the drain terminals connected to one terminal of the anti-fuse element 11 and one terminal of the resistor element Rp. The transistor MD1 has the other terminal connected to the power supply terminal B with the ground potential, via a node N1 and the ground wiring GND. The anti-fuse element 11 has the other terminal connected to the other terminal of the resistor element Rp and the power supply terminal A via a node N2. An example of the transistor MD1 includes an NMOS transistor.

The resistor element Rp provided in parallel with the anti-fuse element 11 makes one and the other terminals of the capacitor element Ca, serving as the anti-fuse element 11, have substantially the same potential when the transistor MD1 is OFF.

An electric path between the transistor MD1 and the anti-fuse element 11 has a resistance R1 as a parasitic resistance. An electric path between the transistor MD1 and the resistor element Rp has a resistance R2 as a parasitic resistance. In this specification, the resistance value may be obtained as a general direct current (DC) resistance.

An operation for writing information to the semiconductor device is described.

When the information is written to the anti-fuse element 11, a signal at a Low level (for example, the signal at the ground potential) is input as the control signal Sig to turn ON the transistor MD1. Thus, the high voltage VH is applied to a gate insulating film of the anti-fuse element 11. As a result, dielectric breakdown of the gate insulating film of the anti-fuse element 11 occurs, whereby the resistance value between the gate of the anti-fuse element 11 and a semiconductor substrate 110 largely drops. In other words, the anti-fuse element 11, serving as the capacitor element Ca before the writing, serves as the resistor element after the writing. In this manner, information is written to the anti-fuse element 11.

Next, an operation performed for the reading is described. A Low level signal is (for example, the signal at the ground potential) is input as the control signal Sig corresponding to the anti-fuse element 11 from which information is to be read, to turn ON the transistor MD1. Whether the information has been written to the anti-fuse element 11 can be determined by measuring the resistance of the anti-fuse element from an external connection terminal. For example, current is applied to the anti-fuse element 11 from the external via the power supply terminal A, and voltage at the power supply terminal A is monitored.

When the anti-fuse element 11 is the capacitor element Ca, because the information has not been written, voltage generated between the nodes N1 and N2 corresponds to a combined resistance of a resistance value of the resistor element Rp, an ON-state resistance of the transistor MD1, and the resistance R2. On the other hand, when the information has been written to the anti-fuse element 11, the voltage that corresponds to a combined resistance of a resistance value of the anti-fuse element 11 after the writing, the resistance of the resistor element Rp, the ON-state resistance of the transistor MD1, and the resistances R1 and R2 is generated between the nodes N1 and N2.

Thus, a combined resistance Rcom0 generated between the nodes N1 and N2 before information is written to the anti-fuse element 11 is represented by the following Formula (1):

$$Rcom0 = Rrp + R2 + Rmd1 \quad \text{Formula (1),}$$

where Rmd1 represents the ON-state resistance of the transistor MD1, Rrp represents the resistance value of the resistor element Rp, and Rca represents the resistance value of the anti-fuse element 11 after the writing.

A combined resistance Rcom1 between the nodes N1 and N2 after information has been written to the anti-fuse element 11 is represented by the following Formula (2):

$$Rcom1 = \frac{(Rca + R1) \times (Rrp + R2)}{(Rca + R1) + (Rrp + R2)} + Rmd1 \quad \text{Formula (2)}$$

Thus, a difference between the combined resistance between the nodes N1 and N2 before the writing and the combined resistance between the nodes N1 and N2 after the writing is represented by the following Formula (3)

$$Rcom0 - Rcom1 = \frac{(Rrp + R2)^2}{(Rca + R1) + (Rrp + R2)} \quad \text{Formula (3)}$$

The anti-fuse element 11 has the following reading characteristics. A larger difference between the combined resistance value before the writing and the combined resistance value after the writing leads to a larger difference in the read voltage, whereby reading can be performed with higher reliability. Thus, Formula (3) described above is preferably set to have a large value on the right side. When the resistance value Rca of the anti-fuse element 11 after the writing and the resistance value Rrp of the resistor element Rp are fixed values, a larger value of the right side of Formula (3) can be achieved with a smaller value of the resistance R1 and a larger value of the resistance R2. In other words, when the value of the resistance R1 is a smaller value and the value of the resistance R2 is a larger value, the difference in the combined resistance between the nodes N1 and N2 before the writing into the anti-fuse element 11 and the combined resistance between the nodes N1 and N2 after the writing the anti-fuse element 11 becomes larger.

Figure 3:
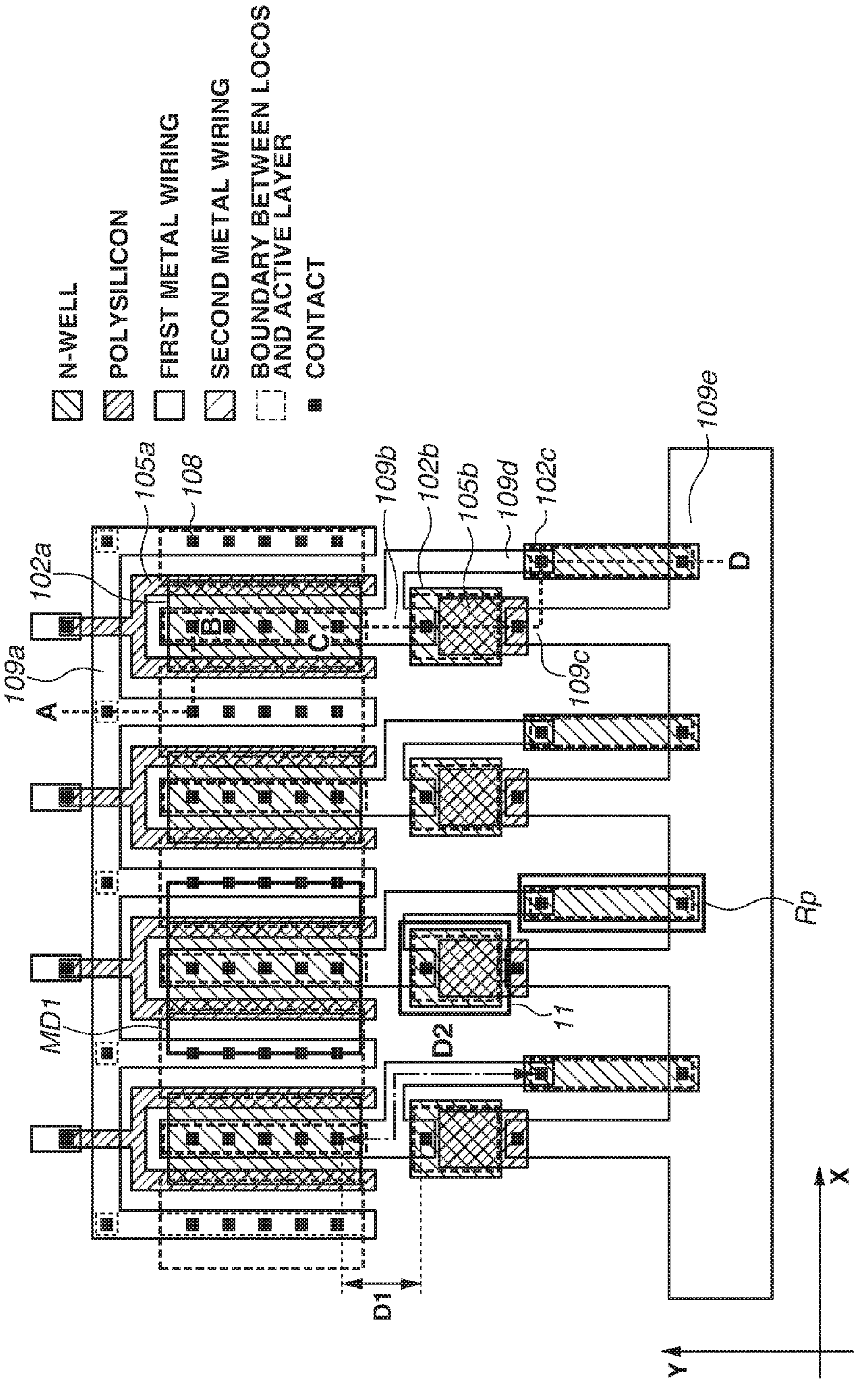
FIG. 3 is a plan view of part of a liquid-discharge head substrate including the semiconductor device.

FIG. 3 is a plan view of part of a liquid-discharge head substrate including the semiconductor device. In FIG. 3, each transistor MD1 includes a gate electrode 105*a* that functions as a gate. The transistor MD1 has a source connected to a conductive layer 109*a* via a contact portion 108 and a drain connected to a conductive layer 109*b* via a contact portion 108. The anti-fuse element 11 includes an N-well region 102*b* and an electrode 105*b*. The resistor element Rp includes an N-well region 102*c*. This configuration is described in detail below with reference to FIG. 5.

In FIG. 3, a plurality of the resistor elements Rp is arranged in an X direction, and each have a shape so that a longitudinal direction thereof extends along a Y direction crossing the X direction. With this configuration, the plurality of resistor elements Rp can be arranged at a short interval. The transistor MD1 preferably has a large channel width so that large current can flow. Thus, the transistor MD1 is formed to have a channel width direction extending along the Y direction. A plurality of the transistors MD1 with the channel width direction extending along the Y direction can be arranged at a short interval. With this configuration, the resistance value of the resistor element Rp and the channel width of the transistor MD1 can be suitably adjusted while preventing the dimension of the liquid-discharge head substrate in the X direction from increasing.

For example, a memory mechanism, including the transistor MD1, the anti-fuse element 11, and the resistor element Rp, may be arranged at a position corresponding to a discharging mechanism, including a discharging element and a driving circuit for the discharging element, in the Y direction. Sets each including the discharging mechanism and the memory mechanism may be arranged in the X direction. In this configuration, as described above, the resistor elements Rp as well as the transistors MD1 are arranged in such a manner as to be arranged at a short interval in the X direction. Thus, the width of the liquid-discharge head substrate in the X direction can be prevented from exceeding a width limited by the discharging mechanisms, or the amount of increase in the width can be reduced.

The resistor element Rp may include a plurality of subordinate resistor elements connected in series. Such a plurality of subordinate resistor elements, if the longitudinal directions thereof extend along the X direction, may be arranged in the Y direction. With such a configuration, the plurality of resistor elements Rp including a large number of the subordinate resistor elements can be arranged in the X direction at a short interval.

Considering the reading characteristics of the anti-fuse element 11, the resistance R1 between the transistor MD1 and the anti-fuse element 11 is preferably set to be a small value, and the resistance R2 between the transistor MD1 and the resistor element Rp is preferably set to be a large value. The above configuration can be achieved with a short electric path between the transistor MD1 and the anti-fuse element 11 and a long electric path between the transistor MD1 and the resistor element Rp, because the resistances R1 and R2 are each a parasitic resistance. The electric path between elements A and B includes, if there are not only a wiring for connecting the element A and the element B but also a connecting portion (for example, contact portion in an insulating layer) for connecting the wiring and each of the elements A and B, the connecting portion.

The same material can be used to form connecting portion (contact portion) for connecting the wiring between the transistor MD1 and the anti-fuse element 11 to each of the elements, and form a connecting portion for connecting wiring between the transistor MD1 and the resistor element Rp to each of the elements. For example, the connecting portions may be formed with a conductive layer provided in openings formed in an insulating film provided over the transistor MD1, the anti-fuse element 11, and the resistor element Rp. In such a case, the connecting portions are made of the same material, and have substantially the same length. The connecting portions may also have substantially the same cross-sectional area.

The connecting portion in the electric path between the transistor MD1 and the anti-fuse element 11 and the connecting portion in the electric path between the transistor MD1 and the resistor element Rp have substantially the same resistance. In such a configuration, the relationship between the resistances R1 and R2 can be adjusted by adjusting the parasitic resistance of the wiring between the transistor MD1 and the anti-fuse element 11 and the parasitic resistance of the wiring between the transistor MD1 and the resistor element Rp.

For example, the anti-fuse element 11 is disposed between the transistor MD1 and the resistor element Rp in the Y direction, in a plan view of a surface the semiconductor substrate in which the transistors MD1, the anti-fuse elements 11, and the resistor elements Rp are arranged as illustrated in FIG. 3. With such an arrangement, the wiring between the transistor MD1 and the anti-fuse element 11 has a length D1 that is shorter than a length D2 of the wiring between the transistor MD1 and the resistor element Rp. In this specification, a length of wiring between the elements A and B is a length between a position of the wiring in contact with the contact portion for connecting to the element A and a position of the wiring in contact with the contact portion for connecting to the element B.

In the foregoing plan view, if the resistor element Rp is disposed between the transistor MD1 and the anti-fuse element 11, the wiring between the transistor MD1 and the anti-fuse element 11 has a length that is longer than a length of the wiring between the transistor MD1 and the resistor element Rp. If wirings are conductive layers made of the same material and have substantially the same wiring width, the relationship between the respective resistances of the wirings depends on the length of each wiring. In a semiconductor device with such a configuration, the value on the right side in Formula (3) becomes small, thereby the difference between the combined resistance between the nodes N1 and N2 before information is written into the anti-fuse element 11 and the combined resistance between the nodes N1 and N2 after information is written into the anti-fuse element 11 becomes small.

On the other hand, in the configuration illustrated in FIG. 3, the length D1 of the wiring between the transistor MD1 and the anti-fuse element 11 can be smaller than the length D2 of the wiring between the transistor MD1 and the resistor element Rp. Thus, if the length of the electric path between the transistor MD1 and the anti-fuse element 11 is smaller, and the electric path between the transistor MD1 and the resistor element Rp is larger, whereby the reading reliability of the anti-fuse element 11 can be improved. In this manner, the reading reliability of the anti-fuse element 11 can be improved with the resistance of the wiring for connecting the transistor MD1 and the anti-fuse element 11 set to be smaller than the resistance of the wiring for connecting the transistor MD1 and the resistor element Rp.

A specific example is described below with the resistance value Rrp of the resistor element Rp assumed to be 1000Ω, the resistance value Rcp of the anti-fuse element 11 after the writing assumed to be 10Ω, and the ON-state resistance Rmd1 of the transistor MD1 assumed to be 1Ω, in the semiconductor device illustrated in FIGS. 1 and 2. The following Table 1 illustrates the combined resistances Rcom0 and Rcom1, in a configuration where the resistance R1 between the transistor MD1 and the anti-fuse element 11 is 1Ω and the resistance R2 between the transistor MD1 and the resistor element Rp is 10Ω, and in a configuration where the resistance R1 is 10Ω and the resistance R2 is 1Ω.

TABLE 1

| | Rcom0 | Rcom1 |
|---|---|---|
| R1 = 1Ω, R2 = 10Ω | 1011Ω | 12Ω |
| R1 = 10Ω, R2 = 1Ω | 1002Ω | 21Ω |

According to the reading characteristics of the anti-fuse element 11 as described above, a higher reading reliability can be achieved with a larger difference (Rcom0–Rcom1) between the combined resistance value before writing and the combined resistance value after writing. As can be seen in Table 1, the difference (Rcom0–Rcom1) between the combined resistance value before writing and the combined resistance value after writing is 999Ω if the resistance R1 is 1Ω and the resistance R2 is 10Ω. On the other hand, the difference (Rcom0–Rcom1) between the combined resistance value before writing and the combined resistance value after writing is 981Ω if the resistance R1 is 10Ω and the resistance R2 is 1Ω.

Thus, the difference between the combined resistance value before writing and the combined resistance value after writing becomes larger so that higher reading reliability can be achieved in the case where the resistance R1 is 1Ω and the resistance R2 is 10Ω, compared with the case where the resistance R1 is 10Ω and the resistance R2 is 1Ω. In other words, higher reading reliability can be achieved if the wiring for connecting the transistor MD1 and the anti-fuse element 11 has a smaller resistance than the wiring for connecting the transistor MD1 and the resistor element Rp. In comparison of the combined resistances Rcom1 after writing, in particular, the combined resistance Rcom1 after writing is suppressed by 60% or lower when the resistance R1 is 1Ω and the resistance R2 is 10Ω than when the resistance R1 is 10Ω and the resistance R2 is 1Ω.

Thus, in the present exemplary embodiment, the anti-fuse element 11 is disposed between the transistor MD1 and the resistor element Rp in the Y direction, in the plan view of the surface of the semiconductor substrate in which the transistors MD1, the anti-fuse elements 11, and the resistor elements Rp are arranged. In such an arrangement, the wiring between the transistor MD1 and the anti-fuse element 11 has the length D1 that is shorter than the length D2 of the wiring between the transistor MD1 and the resistor element Rp. In other words, the electric path between the transistor MD1 and the anti-fuse element 11 is shorter than the electric path between the transistor MD1 and the resistor element Rp. With such a configuration, high reading reliability of the anti-fuse element 11 serving as a memory element can be achieved.

The transistor MD1, the anti-fuse element 11, and the resistor element Rp are arranged in the Y direction within the range having a width in the X direction that is equal to or smaller than the width of the discharging element and the width of the driving circuit for the discharging element. Thus, the liquid-discharge head substrate can be prevented from having an excessively large dimension in the X direction.

For example, information is written to the anti-fuse element by using an inspection machine in a factory at the time of product shipment. Alternatively, the anti-fuse element may be installed in a main body of a product and information may be written after the user starts using the product. In such a case, a voltage corresponding to the high voltage VH is supplied from the product main body.

Figure 4:
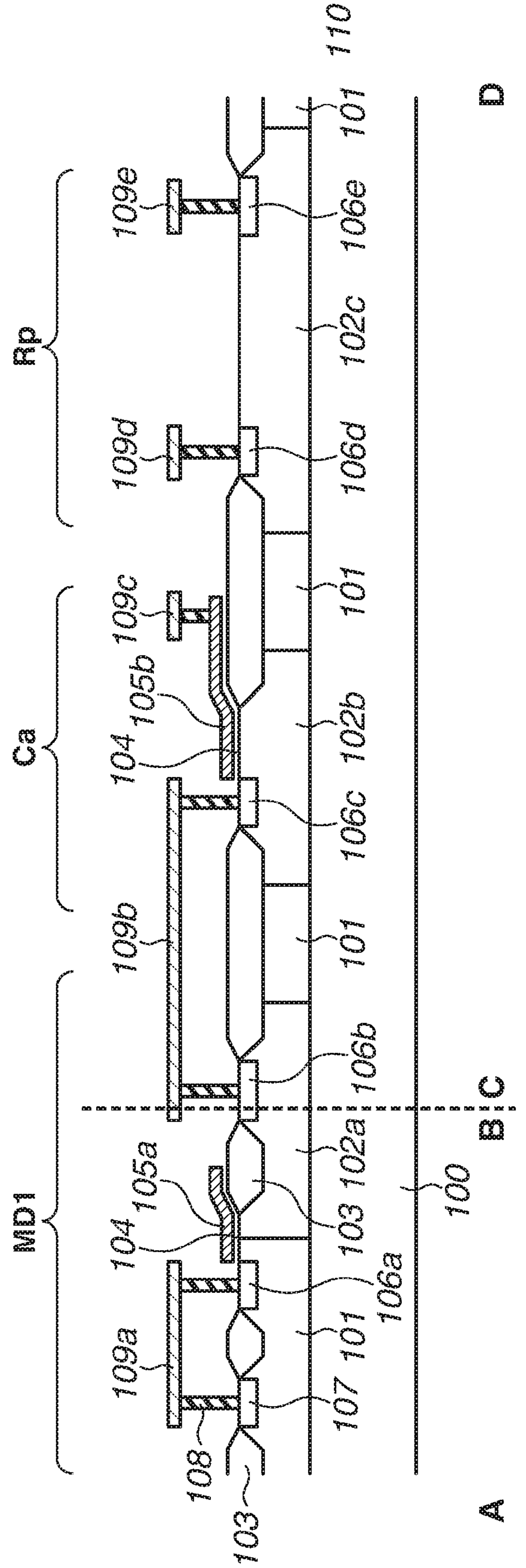
FIG. 4 is a schematic cross-sectional view of part of the liquid-discharge head substrate

FIG. 4 is a schematic cross-sectional view of the liquid-discharge head substrate illustrated in FIG. 3 taken along a line A-B and a line C-D.

In the semiconductor substrate 110, a P-well region 101 and N-well regions 102*a*, 102*b*, and 102*c* are formed on a P-type silicon substrate 100. The P-well region 101 can be formed in the same process as that for forming a P-well region of the NMOS transistor forming the logic circuit. The N-well regions 102*a*, 102*b*, and 102*c* can be formed in the same process as that for forming a N-well region of the PMOS transistor forming the logic circuit.

An impurity concentration of the N-well regions relative to the P-type silicon substrate 100 is the concentration acquired when the breakdown voltage between the N-well regions 102*a*, 102*b*, and 102*c* and the P-type silicon substrate 100 is higher than the high voltage VH. An impurity concentration of the P-well region 101 and the N-well regions 102*a*, 102*b*, and 102*c* is the concentration acquired when the breakdown voltage between the P-well region 101 and the N-well regions 102*a* and 102*b* is higher than the high voltage VH.

A field oxide film 103, high-concentration N-type diffusion regions 106*a* to 106*e*, and a high-concentration P-type diffusion region 107 are formed on the P-well region 101 and the N-well regions 102*a*, 102*b*, and 102*c*. For example, the field oxide film 103 can be formed by Local Oxidation of Silicon (LOCOS).

A configuration of the transistor MD1 serving as a high-voltage NMOS transistor is described. The gate electrode 105*a* is disposed on the P-well region 101 and the N-well region 102*a* adjacent to each other, via a gate insulating film 104. A region where the P-well region 101 and the gate electrode 105*a* overlap with each other is a channel forming region.

The high-concentration N-type diffusion region 106*a* and the high-concentration P-type diffusion region 107 are the source and the back gate electrodes of the transistor MD1, respectively. The N-well region 102*a* has a portion extending under the gate electrode 105*a*, as an electric field relaxing region of the drain. The high-concentration N-type diffusion region 106*b* formed in the N-well region 102*a* serves as the drain electrode of the transistor MD1. The drain side of the gate electrode 105*a* has the LOCOS offset structure in which the drain side overrides the field oxide film 103 formed in the N-well region 102.

Thus, even if the transistor MD1 is in the OFF state, i.e., the potential of the gate electrode is a ground potential and the voltage of the drain electrode rises to the high voltage VH, a gate-drain breakdown voltage can be ensured.

Next, a configuration of the anti-fuse element 11 is described. The anti-fuse element 11 includes an upper electrode, a lower electrode, and an insulating layer therebetween. For example, the electrode 105*b* disposed on the N-well region 102*b* via the gate insulating film 104 functions as the upper electrode of the anti-fuse element 11. A portion of the N-well region 102*b* that is connected to the high-concentration N-type diffusion region 106*c* and overlaps with the upper electrode in a plan view of the surface in which the elements including the transistor MD1 of the semiconductor substrate 110 are arranged functions as the lower electrode. The surface on which the transistor MD1, the anti-fuse element 11, and the resistor element Rp are arranged as seen in a plan view is, for example, a surface of the channel forming region of the transistor MD1 as seen in a plan view.

In FIG. 4. the high-concentration N-type diffusion region 106*c* is formed only in a region of the N-well region 102*b* not overlapping with the upper electrode in the plan view. However, the configuration of the high-concentration N-type diffusion region 106*c* is not limited to thereto. For example, the high-concentration N-type diffusion region 106*b* may be formed in part of or entirety of the region overlapping with the upper electrode. When the high-concentration N-type diffusion region 106*c* is formed also in the region overlapping with the upper electrode in the plan view, the overlapping portion of the high-concentration N-type diffusion region 106*c* also functions as the lower electrode of the anti-fuse element 11.

In FIG. 4, the lower electrode of the anti-fuse element 11 is connected to the drain of the transistor MD1. Alternatively, the upper electrode may be connected to the drain of the transistor MD1, and the lower electrode may be connected to the high voltage VH.

For example, the gate insulating film 104 may be formed as an oxide film in a process of forming the gate insulating film of the transistors MP1 and MN1 forming the logic circuit. For example, the gate electrodes 105*a* and 105*b* may be polysilicon layers. The polysilicon layers, the high-concentration N-type diffusion regions 106*a* to 106*c*, and the high-concentration P-type diffusion region 107 may be formed in a process for forming the elements of the transistors MP1 and MN1 forming the low-breakdown voltage-logic circuit.

In this manner, if an anti-fuse element having an MOS structure is used for the anti-fuse element 11, a MOS transistor is used for the transistor for controlling writing to the anti-fuse element 11, the anti-fuse element and the transistor can be formed in the same process. Thus, the semiconductor device can be formed with a small number of processes and at a low cost.

Insulating films provided with a plurality of the contact portions 108 are provided on the high-concentration P-type diffusion region 107, the N-type diffusion regions 106*a* to 106*e*, and the field oxide film 103. Conductive layers 109*a* to 109*e* are provided on the insulating films. For example, the conductive layers 109*a* to 109*e* may be formed of metal such as aluminum. The manufacturing methods, materials, and structures of the conductive layers 109*a* to 109*e*, the electrodes, and the wiring are not limited thereto, as long as these components can be electrically connected to each other.

FIG. 4 illustrates an example where the anti-fuse element 11 is a capacitor element having the upper electrode and the lower electrode formed of polysilicon and the N-well region 102*b*. The structure of the anti-fuse element 11 is not limited thereto, and may be a capacitor element employing a PMOS transistor, for example. Either one of the lower electrode and the upper electrode of the anti-fuse element 11 functions as one terminal, and the other functions as the other terminal.

The resistor element Rp includes the N-well region 102*c* as a semiconductor region in the semiconductor substrate 110, connected to the conductive layers 109*d* and 109*e* respectively via the high-concentration N-type diffusion regions 106*d* and 106*e*. However, the structure of the resistor element Rp is not limited thereto. For example, a resistor formed of a conductive layer or a resistor formed of polysilicon may be used for the resistor element Rp.

The conductive layer 109*a* is connected to the source and the back gate of the transistor MD1 via the contact portions 108, and is provided with the ground potential. The conductive layer 109*b* is connected to the drain of the transistor MD1 and the lower electrode of the anti-fuse element 11 via the contact portions 108. The conductive layer 109*c* is connected to the upper electrode of the anti-fuse element 11 and the resistor element Rp via the contact portion 108, and the high voltage VH is applied thereto at the time of writing. As illustrated in FIG. 3, the conductive layer 109*d* continues from the conductive layer 109*b*. Thus, the conductive layers 109*b* and 109*d* are the same conductive layer.

In the conductive layer 109*b* (wiring), establishing connection between the drain electrode 106*b* of the transistor MD1 and the lower electrode 106*c* of the anti-fuse element 11, a parasitic resistance between portions in contact with the contact portions 108 is the resistance R1. The parasitic resistance of the conductive layer 109*d* and part of the conductive layer 109*b* connecting the N-type diffusion region 106*e* formed in contact with the resistor element Rp and the drain electrode 106*b* of the transistor MD1 and the contact resistance of a portion connecting the N-type diffusion region 106*e* and the conductive layer 109*d* are each the resistance R2. In this specification, the resistance of the wiring between the transistor MD1 and the anti-fuse element 11 indicates the resistance R1 described above, and the resistance of the wiring between the transistor MD1 and the resistor element Rp indicates the resistance R2 described above.

In the present exemplary embodiment, the wiring between the transistor MD1 and the anti-fuse element 11 has the length D1 shorter than the length D2 of the wiring between the transistor MD1 and the resistor element Rp. In other words, the length of the electric path between the transistor MD1 and the anti-fuse element 11 is smaller than that of the electric path between the transistor MD1 and the resistor element Rp. For example, the anti-fuse element 11 is disposed between the transistor MD1 and resistor element Rp in the plan view of the surface of the semiconductor substrate in which the transistor MD1, the anti-fuse element 11, and the resistor element Rp are arranged. That is, in the plan view, the distance between the transistor MD1 and the anti-fuse element 11 is shorter than that between the transistor MD1 and the resistor element Rp.

Such a configuration can improve reading reliability of the anti-fuse element serving as a memory element. In the configuration, the resistance (resistance R1) of the wiring between the transistor MD1 and the anti-fuse element 11 is smaller than the resistance (resistance R2) of the wiring between the transistor MD1 and the resistor element Rp.

A second exemplary embodiment is described below. The present exemplary embodiment is described as an application example where the semiconductor device according to the first exemplary embodiment is applied to a liquid-discharge device.

Figure 5:
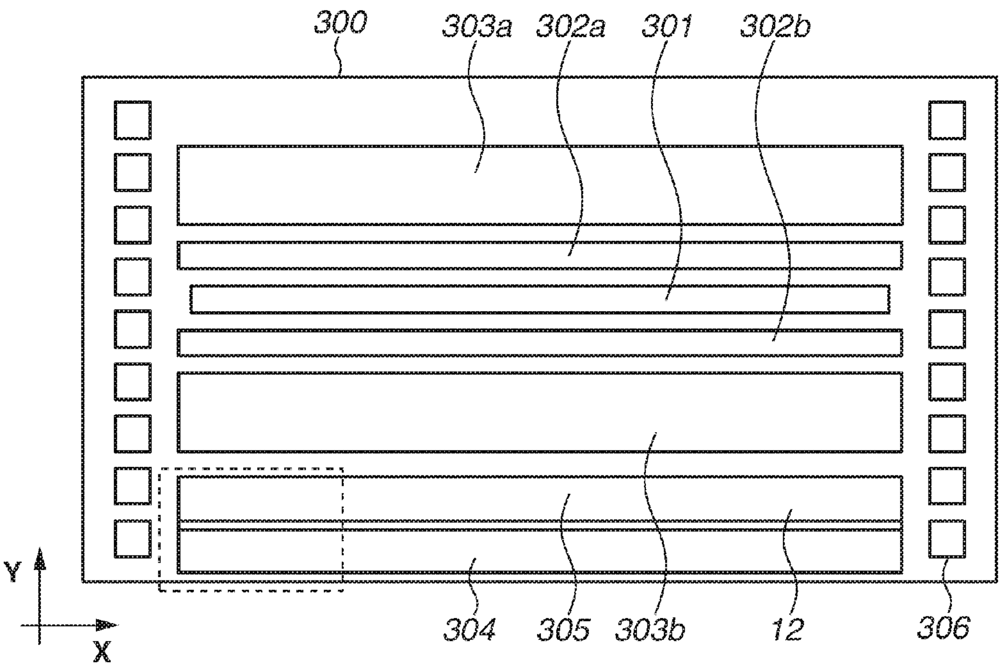
FIG. 5 is a schematic plan view of the liquid-discharge head substrate.

FIG. 5 is a schematic plan view of a surface of the semiconductor substrate 110 on which the elements are formed, in the liquid-discharge head substrate including the semiconductor device according to the present exemplary embodiment. A liquid-discharge head substrate 300 includes a supply port 301, discharging element groups 302*a* and 302*b* including a plurality of discharging elements, driving circuit portions 303*a* and 303*b*, an anti-fuse element group 304, and a resistor element group 305.

The supply port 301 extends in the X direction. The discharging element groups 302*a* and 302*b* each include the plurality of discharging elements arranged in the X direction and are arranged along the Y direction crossing the X direction with the supply port 301 therebetween. In this example, the Y direction is orthogonal to the X direction. The driving circuit portions 303*a* and 303*b* each include a plurality of driving circuits. Each of the plurality of driving circuits drives a corresponding one of the discharging elements in the discharging element groups 302*a* and 302*b*. For example, the driving circuit includes an AND circuit and a MOS transistor.

The anti-fuse element group 304 includes a plurality of the anti-fuse elements 11 arranged along a side of the semiconductor substrate 110 extending in the X direction. The resistor element group 305 is arranged between the anti-fuse element group 304 and the driving circuit portion 303*b* and includes the plurality of resistor elements Rp arranged in the X direction and each connected in series with a corresponding one of the anti-fuse elements 11.

A plurality of power supply terminals 306 is arranged along sides of the semiconductor substrate 110 extending in the Y direction. An adjustment unit 12 may be disposed in a position in such a manner that the temperature of the resistor element Rp is adjustable. For example, the adjustment unit 12 may be disposed in a position overlapping with the resistor element group 305 including the plurality of resistor elements Rp in the plan view of the surface in which the elements of the semiconductor substrate 110 are formed. FIG. 3 illustrates a detailed plan view of a partial region of the liquid-discharge head substrate including the semiconductor device, indicated by a dotted line in FIG. 5.

Figure 6:
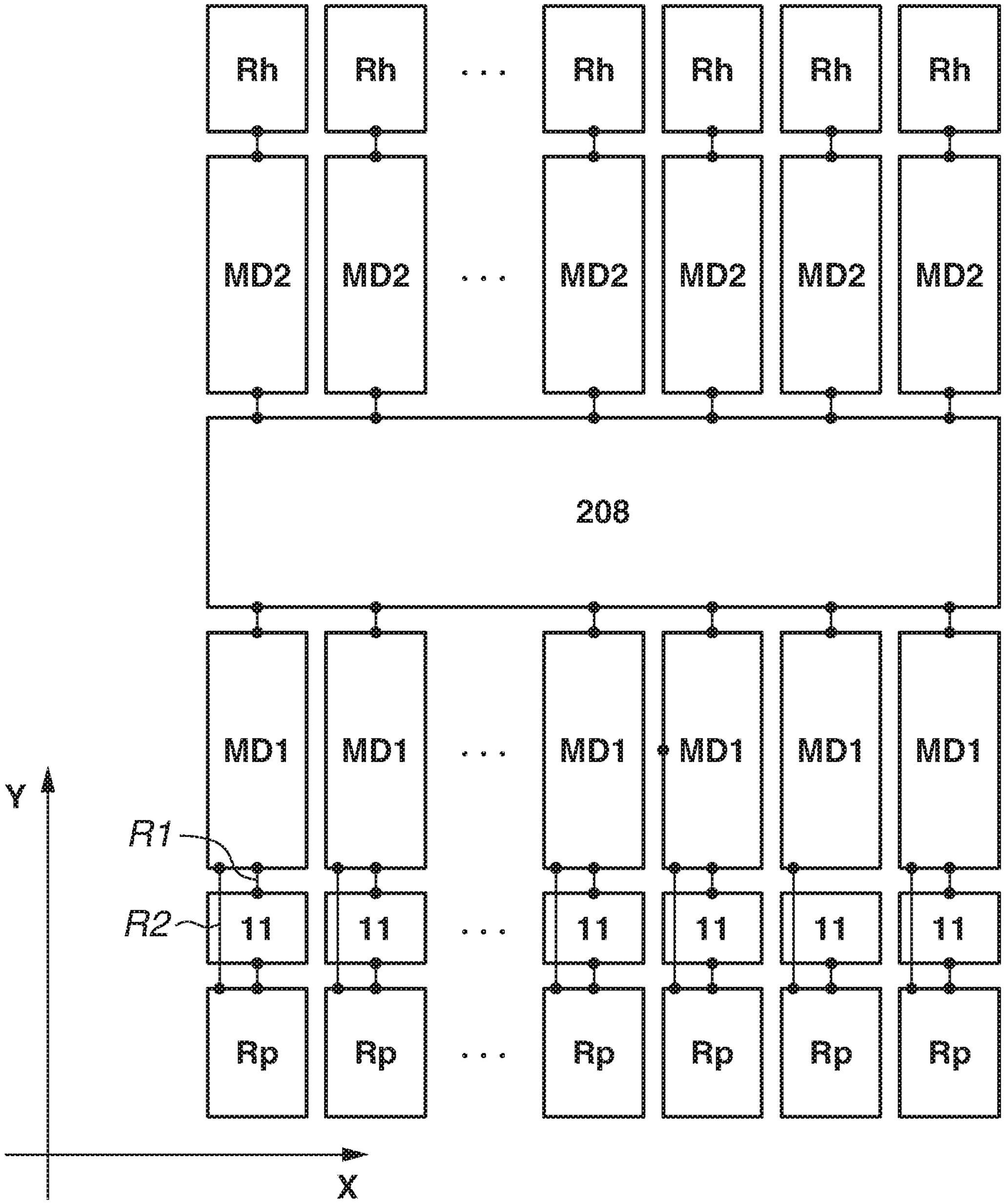
FIG. 6 is a diagram illustrating an example of arrangement in a liquid-discharge head substrate according to a second exemplary embodiment.

FIG. 6 is a diagram illustrating an arrangement in the liquid-discharge head substrate including the semiconductor device according to the first exemplary embodiment. The resistor elements Rp, the anti-fuse elements 11, and the transistors MD1, are arranged at an interval that is the same as an interval between the heaters Rh, serving as discharging elements, in the X direction. A control unit 208 including a control circuit 203, signals 204, 205, 206, and 207 and NAND circuits illustrated in FIG. 7 controls the transistor MD1 and the transistor MD2. 7.

The anti-fuse element 11 is disposed close to the transistor MD1. More specifically, a distance between the transistor MD1 and the anti-fuse element 11 is shorter than a distance between the transistor MD1 and the resistor element Rp. In this configuration, the length of the electric path between the transistor MD1 and the anti-fuse element 11 is shorter than that of the electric path between the transistor MD1 and the resistor element Rp. In other words, the wiring connecting the transistor MD1 and the anti-fuse element 11 has a length shorter than that of the wiring connecting the transistor MD1 and the resistor element Rp.

Thus, the liquid-discharge head substrate can be configured in such a manner that the wiring connecting the transistor MD1 and the anti-fuse element 11 has a lower resistance than that of the wiring connecting the transistor MD1 and the resistor element Rp. Thus, the reading reliability of the anti-fuse element 11 serving as a memory element can be improved.

Figure 7:
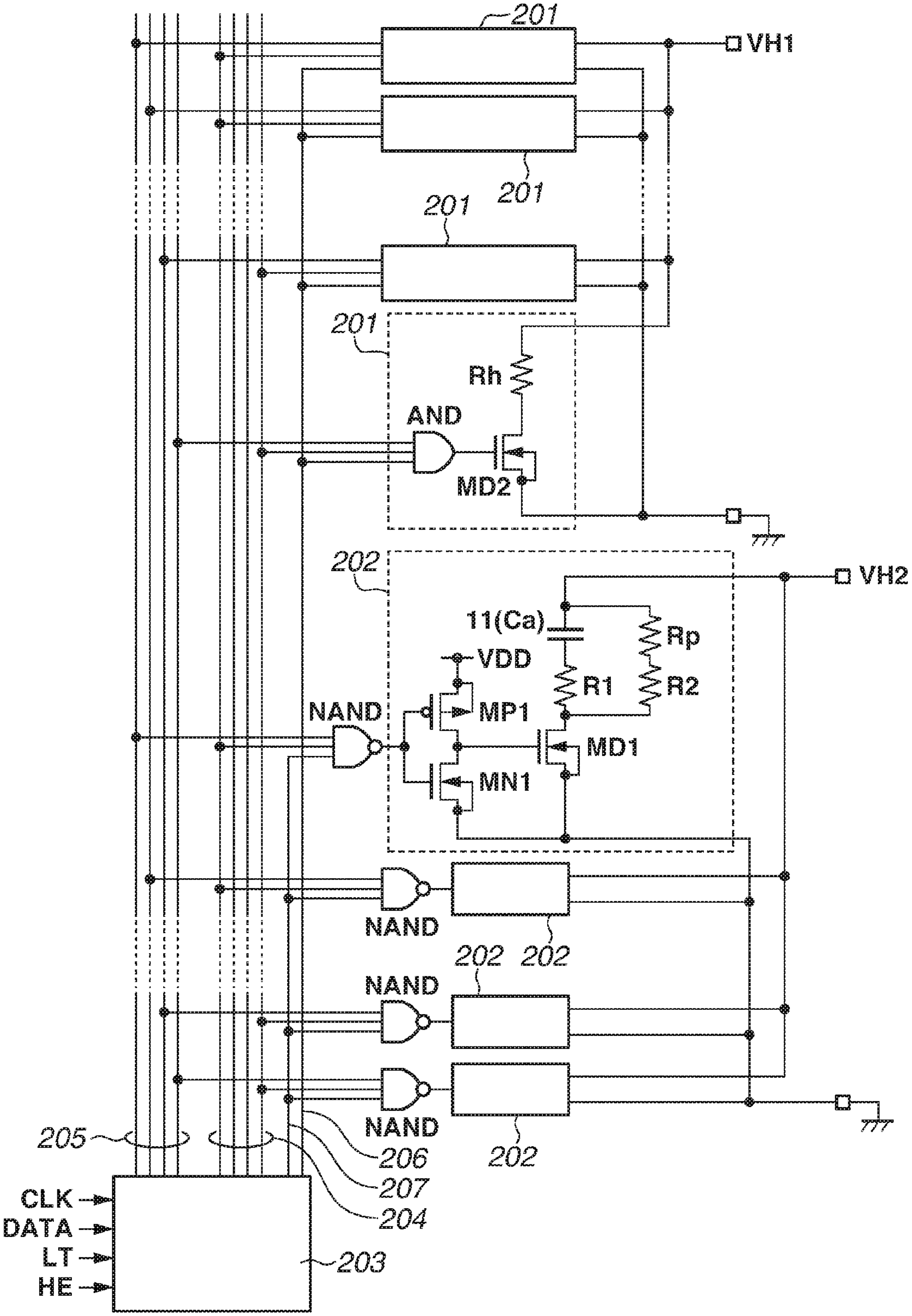
FIG. 7 is a diagram illustrating an example of a circuit configuration of the liquid-discharge head substrate according to the second exemplary embodiment.

FIG. 7 illustrates an example of a circuit configuration of the liquid-discharge head substrate including the semiconductor device (memory unit 10) according to the first or second exemplary embodiment. The liquid-discharge head substrate includes the memory unit 10, the NAND logic circuits and recording units 201.

The memory unit 10 includes an inverter including the transistor MP1 and the transistor MN1, the transistor MD1, the anti-fuse element 11 (capacitor element Ca), and the resistor element Rp. The recording unit 201 includes the heater Rh (thermoelectric conversion element), i.e., the discharging element, and a driving unit (for example, the transistor MD2 and an AND logic circuit) that drives the heater Rh. Recording can be performed with a recording material discharged by driving the heater Rh, i.e., by generating heat by turning ON the heater Rh.

The control circuit 203 may include, for example, a shift register and a latch circuit (not illustrated). For example, a clock signal CLK, an image data signal DATA, a latch signal LT, and a heater control signal HE may be input to the control circuit 203 via a host personal computer (PC) (not illustrated). A first power supply voltage $V_{DD}$ (for example, 3 V to 5 V) is supplied, as a power voltage for logic operations, to the AND and the NAND circuits as well as the control circuit 203. The recording unit 201 and the memory unit 10 are each electrically connected to the control circuit 203.

For example, for m groups each including n recording units 201, the control circuit 203 can perform time-division driving of the heater RH, for each group, by controlling operations of the recording unit 201. The time-division driving can be achieved when the control circuit 203 outputs an m-bit block selection signal 204 and an n-bit time-division selection signal 205.

The corresponding block selection signal 204 and time-divisional selection signal 205 are input to the AND logic circuit, and accordingly the transistor MD2 is brought into a conductive state to drive the heater RH. At this time, a second power supply voltage VH1 (for example, 24 V), as a power supply voltage for driving the heater Rh, is supplied to the recording unit 201, and the potential of the ground wiring GND is the ground potential.

The control signal 206 and the time-division selection signal 205 are input to the NAND logic circuit, and the inverter outputs a corresponding signal to the transistor MD1. Thus, the transistor MD1 is switched between a conductive state and a non-conducted state. A third power supply voltage VH2 for writing information to the anti-fuse element 11 (capacitor element Ca) is supplied to the memory unit 10, and the potential of the ground wiring GND is the ground potential.

Figure 8:
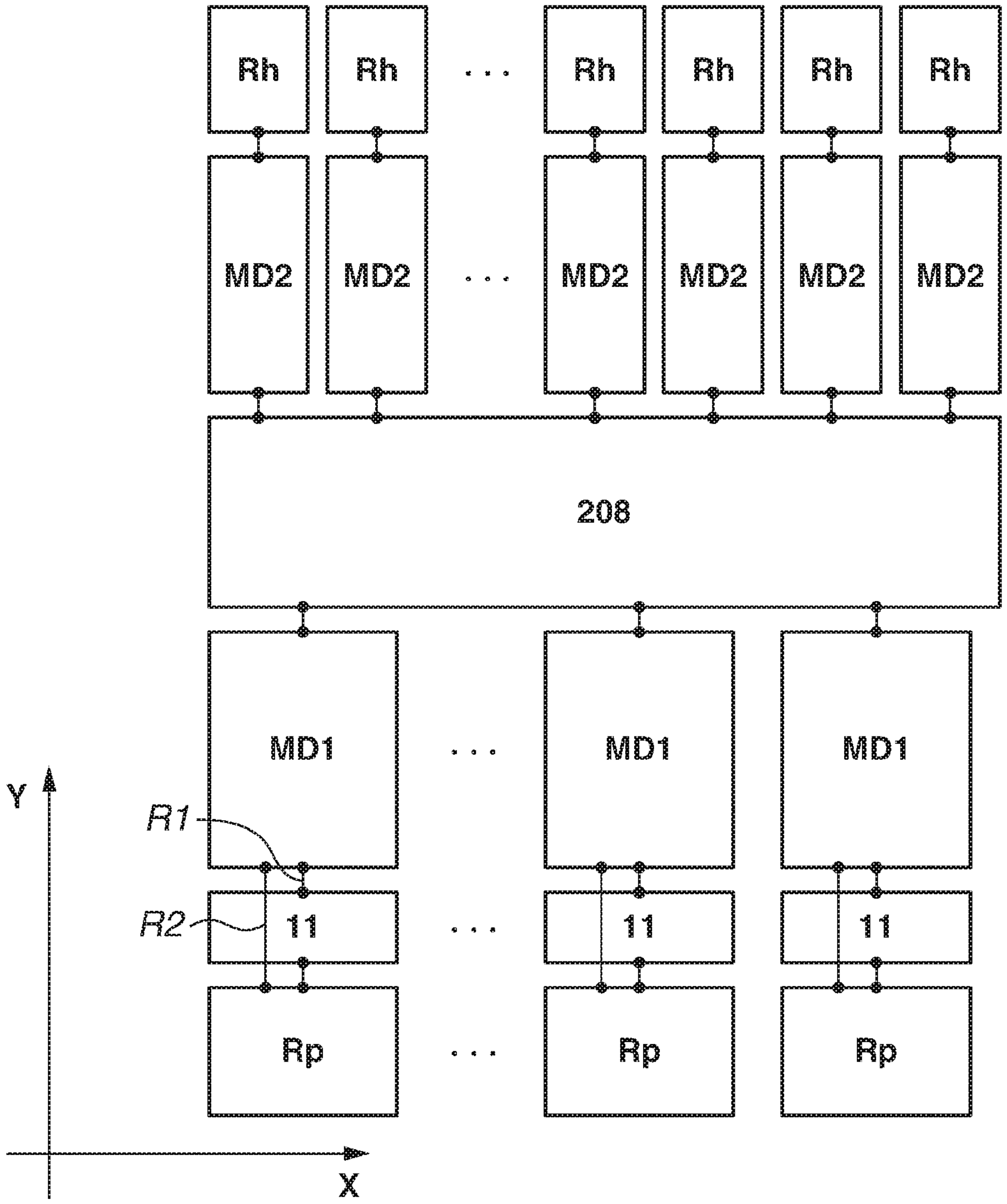
FIG. 8 is a diagram illustrating an example of arrangement in the liquid-discharge head substrate according to the second exemplary embodiment.

In the present exemplary embodiment, the transistors MD1, the anti-fuse elements 11 and the resistor elements Rp are arranged at the same interval as the interval between the heater Rh (discharging elements) in the X direction. However, the configuration of the liquid-discharge head substrate according to the present exemplary embodiment is not limited thereto. For example, as illustrated in FIG. 8, the transistors MD1, the anti-fuse elements 11, and the resistor elements Rp may be arranged at an interval that is twice as large as the interval between the heaters Rh in the X direction. Furthermore, there may be a region having no anti-fuse element 11. The functional units of the control unit 208 may not all be disposed between the anti-fuse element and the recording element. Part of the functional units commonly used for controlling the anti-fuse element and the recording element may be disposed therebetween.

A third exemplary embodiment is described below. In the present exemplary embodiment, an example of a liquid-discharge device that employs an inkjet recording method and includes the semiconductor device according to the first exemplary embodiment or the liquid-discharge head substrate according to the second exemplary embodiment is described with reference to FIG. 9. The configuration of the liquid-discharge device is not limited thereto, a melting-type or sublimation-type liquid-discharge device may also be employed.

For example, the liquid-discharge device may be a single function printer having a recording function only, or may be a multifunction printer having a plurality of functions including, such as a recording function, a FAX function, a scanner function and other functions. The liquid-discharge device may be a manufacturing device for manufacturing, for example, a color filter, an electronic device, an optical device, or a minute structure using a predetermined recording method.

The term "recording" can include not only the formation of images, designs, patterns, structures, and the like which are so visualized as to be visually perceivable by humans on a recording medium, but also the processing of the medium. The term "recording medium" can include not only paper used in general liquid-discharge devices, but also materials capable of accepting recording materials, such as cloth, a plastic film, a metal plate, glass, ceramics, resin, wood, and leather. The term "recording material" can include not only a liquid which, when applied onto a recording medium, can form images, designs, patterns, and the like or can process the recording medium, but also liquid which can be used for recording material processing (for example, solidification or insolubilization of a coloring material contained in the recording material).

Figure 9A:
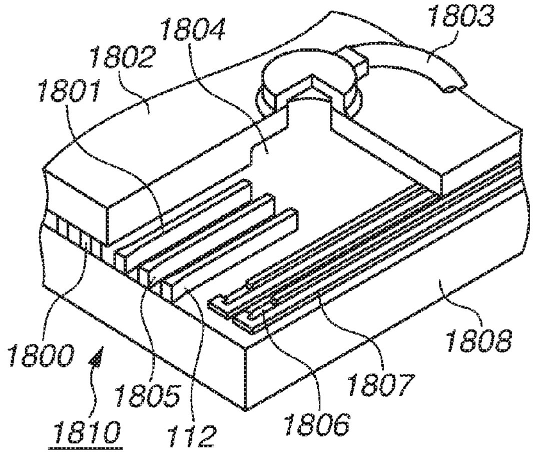
FIGS. 9A-9D are diagrams illustrating a liquid-discharge device according to a third exemplary embodiment.

FIG. 9A illustrates a main part of a liquid-discharge head 1810. The liquid-discharge head 1810 includes an ink supply port 1803. The heater Rh in the foregoing exemplary embodiments is described as a heat generating unit 1806 in FIG. 9A. As illustrated in FIG. 9A, the liquid-discharge head 1810 can be formed by assembling flow path wall members 1801 for forming flow paths 1805 that communicate with a plurality of discharge ports 1800 and a top plate 1802 including the ink supply port 1803 on a base member 1808. In this configuration, ink injected through the ink supply port 1803 is accumulated in an internal common liquid chamber 1804, and is supplied to each of the liquid paths 1805. In this state, the base member 1808 and the heat generating unit 1806 are driven, whereby the ink is discharged from the discharge ports 1800.

Figure 9B:
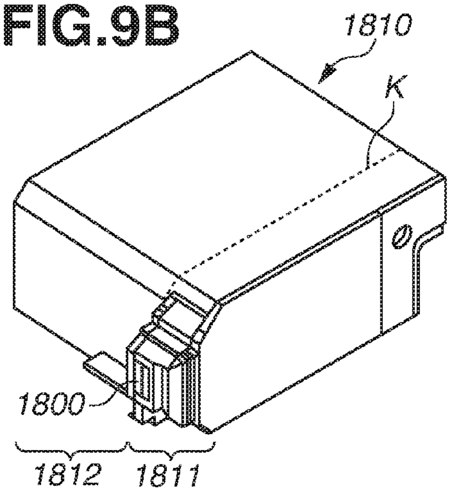

FIG. 9B is a diagram illustrating an overall configuration of the liquid-discharge head 1810. The liquid-discharge head 1810 includes a recording unit 1811 and an ink container 1812. The recording unit 1811 includes the plurality of discharge ports 1800 described above and the liquid-discharge head substrate 300 according the first or second exemplary embodiment. The ink container 1812 stores ink to be supplied to the recording unit 1811. The ink container 1812, on one side of a boundary K, is detachably attached to the recording unit 1811. The liquid-discharge head 1810 is provided with an electrical contact (not illustrated) for receiving an electrical signal from a carriage side when mounted on a liquid-discharge device 1900 illustrated in FIG. 9C. The heat generating unit 1806 generates heat based on the electrical signal. The ink container 1812 incorporates a fibrous or porous ink absorbing member for holding the ink.

The liquid-discharge head 1810 illustrated in FIG. 9B is mounted on a main body of the liquid-discharge device 1900 employing an inkjet recording method (hereinafter, inkjet liquid-discharge device 1900), and a signal supplied from the main body to the liquid-discharge head 1810 is controlled. With such a configuration, the inkjet liquid-discharge device 1900 that enables to achieve high-speed and high-quality recording can be provided. The inkjet liquid-discharge device 1900 using the liquid-discharge head 1810 is described below.

Figure 9C:
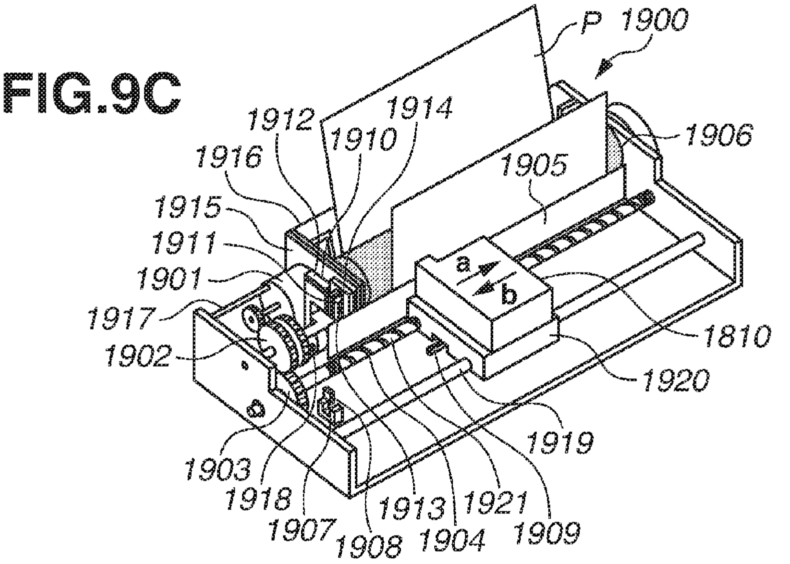

FIG. 9C is an outer perspective view of the inkjet liquid-discharge device 1900 according to the present exemplary embodiment of the present disclosure. In FIG. 9C, the liquid-discharge head 1810 is mounted on a carriage 1920 engaged with a helical groove 1921 of a lead screw 1904 that rotates via driving force transmission gears 1902 and 1903, in accordance with normal/reverse rotation of a driving motor 1901. In such a configuration, the liquid-discharge head 1810 is reciprocally movable along a guide 1919 together with the carriage 1920 in directions indicated by arrows a and b by the driving force from the driving motor 1901. A paper pressing plate 1905 for pressing a recording sheet P conveyed onto a platen 1906 by a recording medium feeding device (not illustrated), presses the recording sheet P against the platen 1906 in a carriage movement direction.

Photocouplers 1907 and 1908 are home position detection units. The photocouplers 1907 and 1908 are used to recognize a presence of a lever 1909 provided in the carriage 1920 in an area provided with the photocouplers 1907 and 1908 and change a rotating direction of the driving motor 1901. A supporting member 1910 supports a cap member 1911 for capping the entire surface of the liquid-discharge head 1810. A suction unit 1912 can evacuate the interior of the cap member 1911, thereby performing suction recovery for the liquid-discharge head 1810 through a cap inner opening 1913. A moving member 1915 enables a cleaning blade 1914 to move in a longitudinal direction thereof. The cleaning blade 1914 and the moving member 1915 are supported by a main body supporting plate 1916. A known cleaning blade may be used instead of the cleaning blade 1914 in the illustrated exemplary embodiment. A lever 1917, provided for starting a sucking operation of the suction recovery, moves in accordance with movement of a cam 1918 engaged with the carriage 1920. The movement of the lever 1917 is controlled by a known transmission unit, such as a clutch switch, based on driving force from the driving motor 1901. A recording control unit (not illustrated) is provided on the main body of the device. The recording control unit supplies a signal to the heat generating unit 1806 provided in the liquid-discharge head 1810 and performs drive control of mechanisms of the driving motor 1901 and other members.

The inkjet liquid-discharge device 1900 having the configuration described above performs recording on the recording sheet P conveyed onto the platen 1906 by the recording medium conveyance device, with the liquid-discharge head 1810 moving in a reciprocal manner over the entire width of the recording sheet P. The liquid-discharge head 1810 includes the liquid-discharge substrate according to the exemplary embodiment described above, and thus enables to achieve both improved ink discharging accuracy and driving with a low voltage at the same time.

Figure 9D:
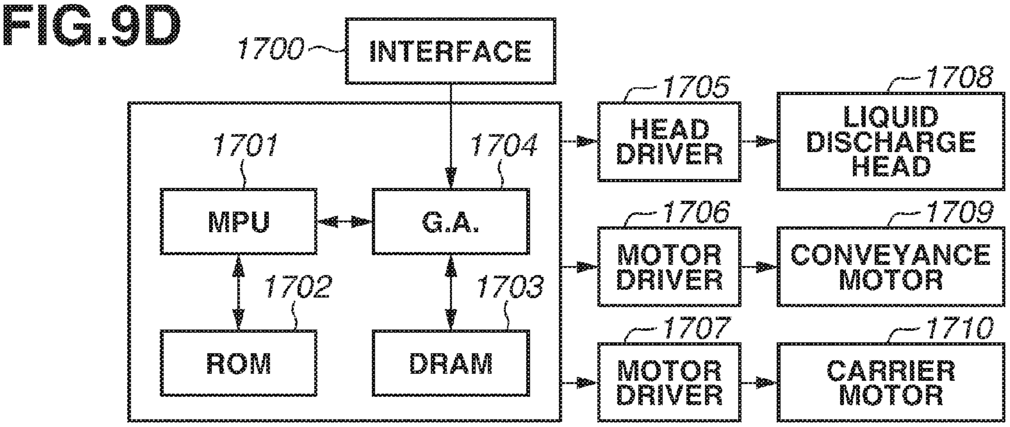

Next, a configuration of a control circuit for executing the recording control for the foregoing device is described below. FIG. 9D is a block diagram illustrating a configuration of the control circuit for the inkjet liquid-discharge device 1900. The control circuit includes an interface 1700 through which a recording signal is input, a microprocessor unit (MPU) 1701, a program read only memory (ROM) 1702, a dynamic random access memory (DRAM) 1703, and a gate array 1704. The program ROM 1702 stores a control program to be executed by the MPU 1701. The DRAM 1703 stores the above recording signal and various types of data such as data supplied to the head. The gate array 1704 performs control for supplying recording data to the liquid-discharge head 1708. The gate array 1704 is performs control for transferring data among the interface 1700, the MPU 1701, and the RAM 1703. The control circuit further includes a carrier motor 1710 for conveying the liquid-discharge head 1708 and a conveyance motor 1709 for conveying the recording sheet P. The control circuit further includes a head driver 1705 for driving the liquid-discharge head 1708 and motor drivers 1706 and 1707 for respectively driving the conveyance motor 1709 and the carrier motor 1710.

An operation of the control configuration is described. When a recording signal is input to the interface 1700, the recording signal is converted into print data between the gate array 1704 and the MPU 1701. Then, when the motor drivers 1706 and 1707 are driven, the liquid-discharge head 1708 is driven in accordance with the print data transmitted to the head driver 1705 to perform printing.

The liquid-discharge device may be a device that has three-dimensional (3D) data and forms a 3D image.

With the semiconductor device according to the first exemplary embodiment or the liquid-discharge head substrate according to the second exemplary embodiment applied to the liquid-discharge device as described above, it is possible to provide a liquid-discharge device with improved reliability.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-169618, filed Aug. 31, 2016, which is hereby incorporated by reference herein in its entirety.

What is claimed is:

1. A semiconductor device comprising:
- a transistor connected to a terminal having a first potential;
- an anti-fuse element connected between the transistor and a terminal having a second potential different from the first potential; and
- a resistor element connected in parallel with the anti-fuse element between the transistor and the terminal having the second potential,
- wherein an electric path between the transistor and the anti-fuse element has a length smaller than a length of an electric path between the transistor and the resistor element.

2. The semiconductor device according to claim 1,
- wherein a channel forming region of the transistor is formed in a semiconductor substrate, and
- wherein the resistor element includes a semiconductor region formed in the semiconductor substrate.

3. A liquid-discharge head substrate comprising:
- a plurality of discharging elements configured to discharge liquid;
- a control circuit electrically connected to the plurality of discharging elements; and
- the semiconductor device according to claim 1 electrically connected to the control circuit.

4. The liquid-discharge head substrate according to claim 3, wherein the plurality of discharging elements is arranged in a first direction.

5. The liquid-discharge head substrate according to claim 4, wherein the resistor element has a shape having a longitudinal direction extending in a second direction crossing the first direction.

6. A liquid-discharge head comprising:
- a recording unit including the liquid-discharge head substrate according to claim 3 and a plurality of discharge ports arranged in such a manner as to each correspond to a different one of the plurality of discharging elements of the liquid-discharge head substrate; and
- an ink container attached to the recording unit.

7. A liquid-discharge device comprising:
- the liquid-discharge head according to claim 6;
- a carriage to which the liquid-discharge head is mounted; and
- a guide used for moving the carriage.

8. A semiconductor device comprising:
- a transistor connected to a terminal having a first potential;
- an anti-fuse element connected between the transistor and a terminal having a second potential different from the first potential; and
- a resistor element connected in parallel with the anti-fuse element between the transistor and the terminal having the second potential,
- wherein the transistor, the anti-fuse element, and the resistor element are arranged on a semiconductor substrate,
- wherein, in a plan view of a surface of the semiconductor substrate, a distance between the transistor and the anti-fuse element is smaller than a distance between the transistor and the resistor element, and
- wherein the transistor, the anti-fuse element, and the resistor element are arranged on the surface of the semiconductor substrate.

9. The semiconductor device according to claim 8, wherein a wiring for connecting the transistor and the anti-fuse element has a length smaller than a length of a wiring for connecting the transistor and the resistor element.

10. The semiconductor device according to claim 8,
- wherein a channel forming region of the transistor is formed in the semiconductor substrate, and
- wherein the resistor element includes a semiconductor region formed in the semiconductor substrate.

11. A liquid-discharge head substrate comprising:
- a plurality of discharging elements configured to discharge liquid;
- a control circuit electrically connected to the plurality of discharging elements; and
- the semiconductor device according to claim 8 electrically connected to the control circuit.

12. The liquid-discharge head substrate according to claim 11, wherein the plurality of discharging elements is arranged in a first direction.

13. The liquid-discharge head substrate according to claim 12, wherein the resistor element has a shape having a longitudinal direction extending in a second direction crossing the first direction.

14. A liquid-discharge head comprising:

a recording unit including the liquid-discharge head substrate according to claim 11 and a plurality of discharge ports arranged in such a manner as to each correspond to a different one of the plurality of discharging elements of the liquid-discharge head substrate; and an ink container attached to the recording unit.

15. A liquid-discharge device comprising:

the liquid-discharge head according to claim 14;

a carriage to which the liquid-discharge head is mounted; and a guide used for moving the carriage.

16. A semiconductor device comprising:

a transistor connected to a terminal having a first potential;

an anti-fuse element connected between the transistor and a terminal having a second potential different from the first potential; and a resistor element connected in parallel with the anti-fuse element between the transistor and the terminal having the second potential, wherein a wiring for connecting the transistor and the anti-fuse element has a resistance smaller than a resistance of a wiring for connecting the transistor and the resistor element.

17. The semiconductor device according to claim 16, wherein the wiring for connecting the transistor and the anti-fuse element has a length smaller than a length of the wiring for connecting the transistor and the resistor element.

18. The semiconductor device according to claim 16, wherein a channel forming region of the transistor is formed in a semiconductor substrate, and wherein the resistor element includes a semiconductor region formed in the semiconductor substrate.

19. A liquid-discharge head substrate comprising:

a plurality of discharging elements configured to discharge liquid;

a control circuit electrically connected to the plurality of discharging elements; and the semiconductor device according to claim 16 electrically connected to the control circuit.

20. The liquid-discharge head substrate according to claim 16, wherein the plurality of discharging elements is arranged in a first direction.

21. The liquid-discharge head substrate according to claim 20, wherein the resistor element has a shape having a longitudinal direction extending in a second direction crossing the first direction.

22. A liquid-discharge head comprising:

a recording unit including the liquid-discharge head substrate according to claim 16 and a plurality of discharge ports arranged in such a manner as to each correspond to a different one of the plurality of discharging elements of the liquid-discharge head substrate; and an ink container attached to the recording unit.

23. A liquid-discharge device comprising:

the liquid-discharge head according to claim 22;

a carriage to which the liquid-discharge head is mounted; and a guide used for moving the carriage.

* * * * *